(12) United States Patent
Heilman et al.

(10) Patent No.: US 11,118,741 B2
(45) Date of Patent: Sep. 14, 2021

(54) LED LAMP UTILIZING OPTICAL FILTERING TO COUNTERACT EFFECTS OF COLOR ANOMALOUS VISION

(71) Applicant: Energy Focus, Inc., Solon, OH (US)

(72) Inventors: Jeremiah A. Heilman, Rochester, MN (US); Dmitri Dmitrievich Kourennyi, Shaker Heights, OH (US); Janna Mino, Beachwood, OH (US)

(73) Assignee: ENERGY FOCUS, INC., Solon, OH (US)

( * ) Notice: Subject to any disclaimer, the term of this patent is extended or adjusted under 35 U.S.C. 154(b) by 31 days.

(21) Appl. No.: 15/809,379

(22) Filed: Nov. 10, 2017

(65) Prior Publication Data

US 2018/0128431 A1  May 10, 2018

Related U.S. Application Data

(60) Provisional application No. 62/420,155, filed on Nov. 10, 2016, provisional application No. 62/565,711, filed on Sep. 29, 2017.

(51) Int. Cl.
| | |
|---|---|
| *F21K 9/275* | (2016.01) |
| *H01L 25/075* | (2006.01) |
| *F21V 9/08* | (2018.01) |
| *H01L 33/44* | (2010.01) |
| *F21K 9/27* | (2016.01) |
| *F21V 9/00* | (2018.01) |

(Continued)

(52) U.S. Cl.
CPC ............ *F21K 9/275* (2016.08); *F21K 9/27* (2016.08); *F21V 9/00* (2013.01); *F21V 9/08* (2013.01); *H01L 25/0753* (2013.01); *H01L 33/44* (2013.01); *F21Y 2103/10* (2016.08); *F21Y 2113/13* (2016.08); *F21Y 2115/10* (2016.08)

(58) Field of Classification Search
CPC ... F21K 9/27; F21K 9/275; F21K 9/60; F21K 9/64; F21V 9/00; F21V 9/08; F21Y 2103/10; F21Y 2113/13; F21Y 2115/10; H01K 25/0753; H01K 33/44
USPC .............. 362/230–231, 249.02, 311.02, 800
See application file for complete search history.

(56) References Cited

U.S. PATENT DOCUMENTS

| 4,826,286 A | 5/1989 | Thornton, Jr. |
| 7,506,977 B1 | 3/2009 | Aiiso |

(Continued)

FOREIGN PATENT DOCUMENTS

WO  97/48134 A1  12/1997

OTHER PUBLICATIONS

Sadeq Qasem; "Can these Glasses Help the Colorblind?"; http://sadeq.me/can-these-glasses-help-the-colorblind/ ; Dated Nov. 8, 2015, 10 pages.

(Continued)

*Primary Examiner* — Jason M Han
(74) *Attorney, Agent, or Firm* — Rankin, Hill & Clark LLP

(57) ABSTRACT

A light emitting diode lamp includes a light source configured to emit light that defines a spectral power distribution curve including a first power peak and a second power peak with a first reduced power area extending therebetween. The first reduced power area defines a first reduced power area minimum in a green color region of the spectral power distribution curve and the spectral power distribution curve compares a power of the light versus a wavelength of the light.

14 Claims, 7 Drawing Sheets

(51) Int. Cl.
*F21Y 113/13* (2016.01)
*F21Y 103/10* (2016.01)
*F21Y 115/10* (2016.01)

(56) References Cited

U.S. PATENT DOCUMENTS

| | | |
|---|---|---|
| 8,210,678 B1 | 7/2012 | Farwig |
| 9,289,574 B2 * | 3/2016 | Maxik ................ H05B 33/086 |
| 9,609,715 B1 * | 3/2017 | Petluri ............... H05B 33/0845 |
| 10,196,565 B2 * | 2/2019 | Vick ........................ F21K 9/64 |
| 2002/0126256 A1 | 9/2002 | Larson |
| 2006/0146275 A1 | 7/2006 | Mertz |
| 2007/0241657 A1 | 10/2007 | Radkov et al. |
| 2010/0259190 A1 | 10/2010 | Aikala |
| 2013/0020929 A1 | 1/2013 | van de Ven et al. |
| 2014/0233105 A1 | 8/2014 | Schmeder et al. |
| 2014/0301062 A1 | 10/2014 | David et al. |
| 2015/0162505 A1 | 6/2015 | Jones |

OTHER PUBLICATIONS

Ben Ouyang; Enchroma Colorblind Glasses Review: Illuminating But Are They Worth the Money? ; https://www.medgadget.com/2017/10/enchroma-colorblind-glasses-review-illuminating-but-are-they-worth-the-money. html ; Dated Oct. 4, 2017, 9 pages.
International Search Report and Written Opinion, PCT/US2017/061103 dated Feb. 12, 2018, 13 pages.

* cited by examiner

LED LAMP UTILIZING OPTICAL FILTERING TO COUNTERACT EFFECTS OF COLOR ANOMALOUS VISION

BACKGROUND

Two of the most common forms of color deficient vision are Protanomaly and Deuteranomaly. For purposes of this disclosure, only individuals with these two forms of color deficient vision will be referred to as suffering from color blindness, whereas those individuals suffering from monochromacy (complete color blindness) or dichromacy (two color vision; There is another form of color-blindness where individuals are missing one of cone types, resulting in the ability to only distinguish 2 colors (such as red-blue)) will not be the subject of this disclosure. Typically, individuals, independent of whether or not they suffer from color blindness, have three types of cones (i.e., short (S), medium (M), and long (L)) for color vision present in the retina.

However, with those individuals that suffer from color blindness, the spectral responses of the medium (M) and long (L) cones of their eyes have more overlap than normal (i.e., a person that does not suffer from color deficient vision). This results in poor hue resolution, as otherwise disparate colors obtain a tint that makes them appear similar to other colors. If a normal vision person could see through color blind eyes, they would find reds and oranges tend to look green, greens look yellowish, while blues look slightly purple. Notably, color blindness affects 8% of men (1 in 12), and 0.5% of women (1 in 200).

Protanomaly results from the L cone response moving towards the normal M cone response and has the following effects: poor hue resolution and an overall yellow-tint in the yellow-green region of the spectrum due to higher overlap with the L cone response; and overall darkening of deep reds due to the reduced L cone response in that region of the spectrum. Deuteranomaly results from the M cone response moving towards the normal L cone response and has the following effects: poor hue resolution and an overall green-tint in the yellow-green region of the spectrum due to higher overlap with the L cone response; and poor hue resolution in the blue-violet region due to the reduced M cone response.

A popular treatment for these forms of color blindness is the use of color filtering glasses, such as those produced by EnChroma. These glasses are aggressive color filters, transmitting relatively narrow bands of red, green, and blue, and specifically removing color content in the L-M overlapping region that causes hue confusion. The EnChroma website shows people having a strong emotional response to having their color vision restored.

However, wearing corrective filtering glasses is inconvenient and is an individual's elective choice. Thus, there is room for improvement.

BRIEF DESCRIPTION

According to an aspect of the present disclosure, a light emitting diode lamp includes a light source configured to emit light that defines a spectral power distribution curve including a first power peak and a second power peak with a first reduced power area extending therebetween. The first reduced power area defines a first reduced power area minimum in a green color region of the spectral power distribution curve and the spectral power distribution curve compares a power of the light versus a wavelength of the light.

According to an aspect, a lamp for illuminating a space includes a light source adapted to emit specific wavelengths of light to restore hue contrast and perception for people that are color blind.

According to an aspect, a method of lighting a space includes the steps of powering a light source, emitting specific wavelengths of light from the light source, and illuminating the space with the light source such that the specific wavelengths of light restore hue contrast for persons that are color blind.

DETAILED DESCRIPTION

Figure 1:
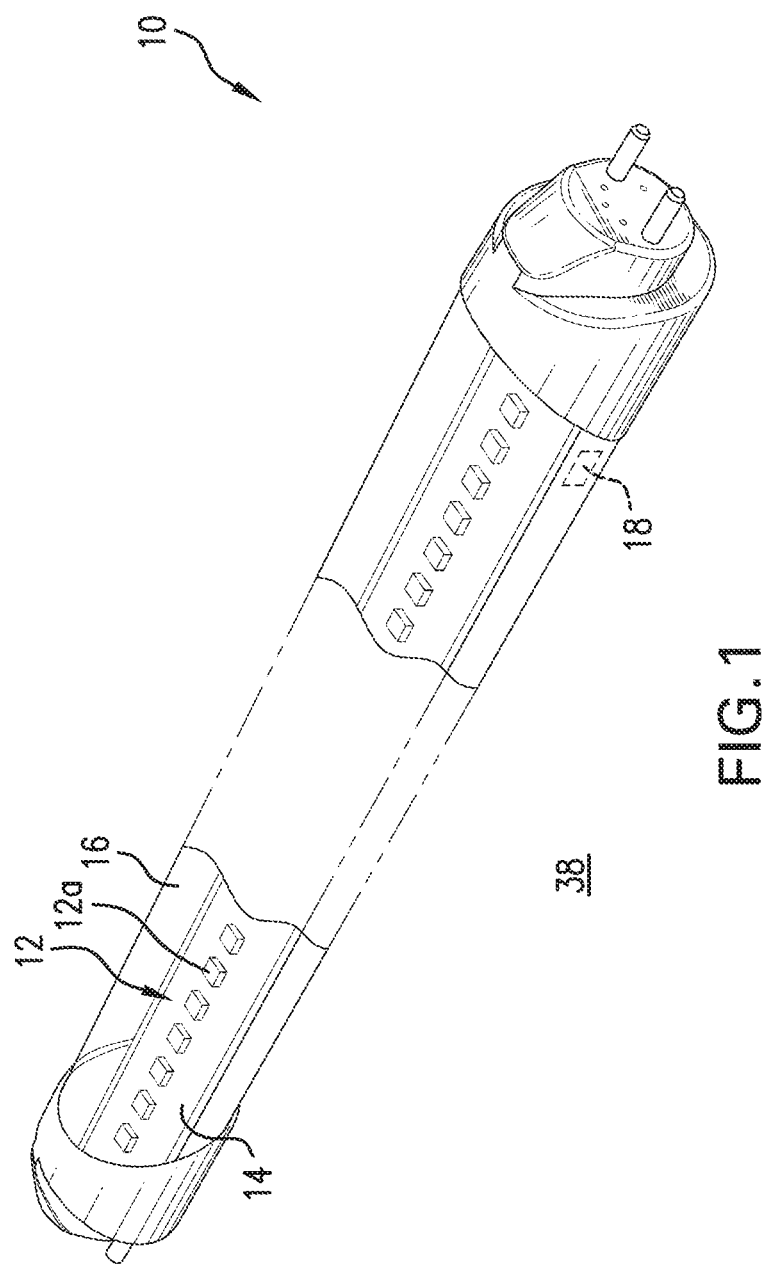
FIG. 1 is a perspective view of a lamp.

FIG. 1 illustrates a lamp 10. The lamp 10 can include a light source 12 that emits light, a housing 14, a lens 16, and a controller 18. As will be described in more detail hereinafter, the lens 16 may also act as a filter.

The lamp 10, and hence the light source 12 can be any number of types, including, for example, incandescent, halogen, fluorescent, and high intensity discharge, and light emitting diode. Thus, the lamp 10 may be a light emitting diode lamp. The light source 12 of the lamp 10 can include a single individual light element 12a. When the lamp 10 only includes a single light element 12a, the single light element 12a can emit light in the visible light spectrum at multiple wavelengths and the lens 16 can have filtering capability as will be discussed in more detail hereinafter. Alternatively, the lamp 10 can include a plurality of individual light elements 12a that each emit a different wavelength of light. Notably, the light source 12 is adapted to emit specific wavelengths of light to restore hue contrast and perception for people that are color blind.

The plurality of individual light elements 12a are illustrated as light emitting diodes. However it will be appreciated that other forms of light elements could be utilized without departing from the scope of this disclosure. Further, the previously referenced light emitting diodes may be narrow band light emitting diodes. When the light element 12a is a light emitting diode, the light element 12a can be devoid of phosphor. Alternatively, the light element 12a can include a green aluminate phosphor having an emission peak at 516 nm and an excitation range of 200 nm to 480 nm and a red nitride phosphor having an emission peak at 618 nm and an excitation range of 200 nm to 610 nm.

Further, the lamp 10 can have a correlated color temperature (CCT) of 4000K, a fidelity index (Rf) equal to 70 and a Gamut Index (Rg) of 90 according to IES TM-30-15 Standard. Further still, the lamp 10 can have a correlated color temperature (COT) of 4000K, a fidelity index (Rf) equal to 80 and a Gamut Index (Rg) of 90.

With continued reference to FIG. 1, the housing 14 receives the light source 12. The housing 14 is illustrated as being a generally planar member for easy attachment of the light source 12. However, it will be appreciated that other shapes of the housing 14 are possible without departing from the scope of this disclosure. For example, if the lamp 10 were an incandescent, halogen lamp, or high intensity discharge lamp, the housing 14 could take the form of a mount structure that would hold the filament, halogen tube, or arc tube, respectively. Further still, if the lamp 10 were a fluorescent lamp, the housing 14 could be the mount structure that would hold the cathode or anode. It is also noted that the housing 14 can include a light absorbing material to reduce unwanted light scattering.

As noted hereinbefore, the lens 16 can be a filter. Further, the lens 16 can be made of any number of materials without departing from the scope of this disclosure. As illustrated in FIG. 1, the lens 16 can have a partially tubular shape. The lens 16 cooperates with the housing 14 to at least partially surround the light source 12. Further, the lens 16 can engage the housing 14 such that the at least one light element 12*a* is disposed entirely between the housing 14 and the lens 16. Thus, the lens 16 permits a transmission of the light from the at least one light element 12*a* to an area exterior to the lamp 10. The filter 16 can also utilize selective notch filtering to remove specific wavelengths of the light. For example, the filter 16 can absorb certain wavelengths of light such that the light source 12 does not illuminate the space with light from approximately 500 nm to approximately 640 nm.

The filter 16 of the lamp 10 could be used in place of a lens for the lamp 10 (i.e., the lens is made of the filter material). Alternatively, the filter 16 can be a stand-alone element that is made of multi-layer polymer material that can be added to a lens of the lamp 10. In such an arrangement, multiple layers of material are stacked to create a reflective filter, where the spectral response of the reflection coefficient is controlled by material property (index of refraction), thickness, and number/stackup of repeating layers. Alternatively, the filter 16 could be made from deposition techniques.

The filter 16 may be arranged with respect the light source 12 such that light is incident the filter 16 at a fixed angle, such that propagation through the filter 16 is constant at all viewing angles. This prevents chromatic aberration or Lenz law effects that serve to distort, widen, or shift the effect of the filter 16.

It is also noted that the lamp 10 could also include a beam dump or light absorbing material. The beam dump or light absorbing material prevents or reduces scattering or re-reflection of light from the filter 16 that could ruin the favorable effects of the filter 16. The filter 16 of the lamp 10 filters blue "high energy visible." Thus, a yellow color cast may be introduced to images. However, this may be offset with complementary filtering at another, non-blue wavelength.

The lamp 10 can also include a controller 18. Alternatively, the controller 18 may be referred to as a driver, a ballast, and/or a transformer without departing from the scope of this disclosure. The controller 18 can convert alternating current that is supplied from the mains to direct current for usage by the light source 12. Additionally, the controller 18 can control the voltage that is supplied to the light source 12.

By way of reference, electromagnetic radiation is characterized by its wavelength (or frequency) and its intensity. When the wavelength is within the visible spectrum (i.e., the range of wavelengths that humans can perceive, from approximately 400 nm to approximately 700 nm), it can be characterized as "visible light." A spectral power distribution curve reflects wavelengths of light which are perceived by the human eye as a variety of colors. Further, the spectral power distribution curve compares a power per unit area per unit wavelength of an illumination.

For example, the color violet has a wavelength of approximately 400-450 nm, the color blue has a wavelength of approximately 450-490 nm, the color cyan has a wavelength of approximately 490-520 nm, the color green has a wavelength of approximately 520-560 nm, the color yellow has a wavelength of approximately 560-590 nm, the color orange has a wavelength of approximately 590-635 nm, and the color red has a wavelength of approximately 635-700 nm.

Figure 3:
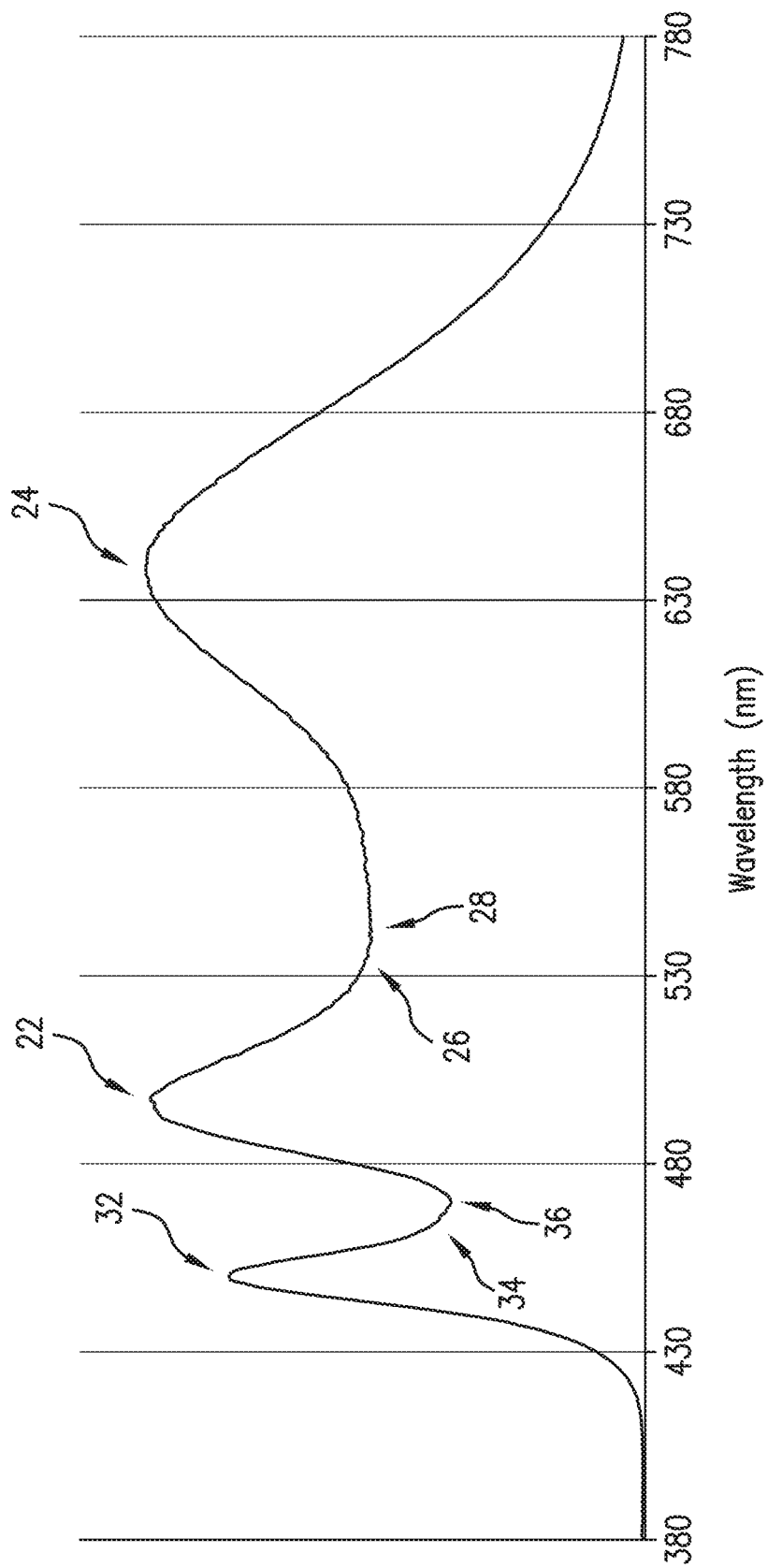
FIG. 3 is a spectral power distribution curve.
Figure 4:
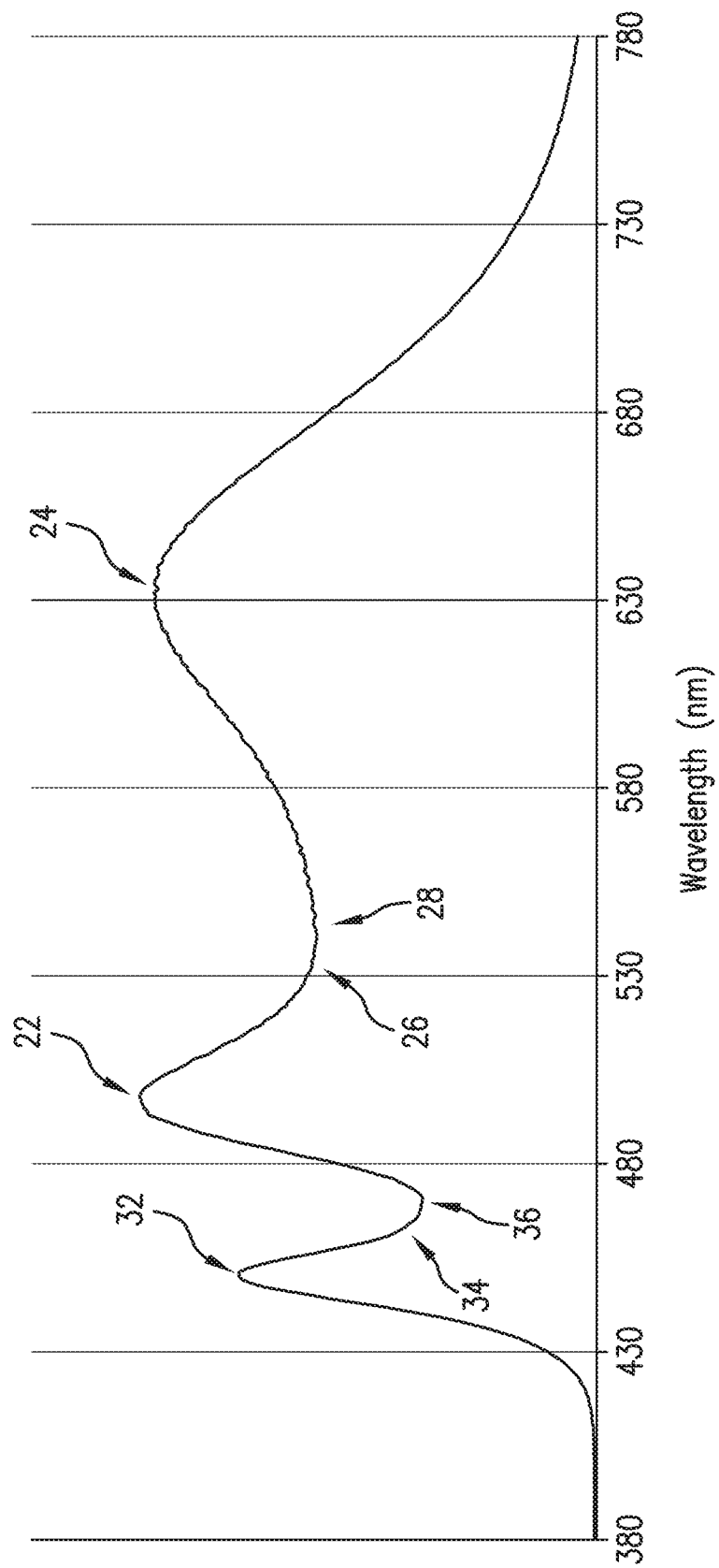
FIG. 4 is a spectral power distribution curve.

The light source 12 of FIG. 1 can emit specific wavelengths of light within the visible light spectrum. With reference to FIGS. 3-4, the light source 12 can be configured to emit light that defines a spectral power distribution curve including a first power peak 22 and a second power peak 24 with a first reduced power area 26 extending therebetween. The first reduced power area 26 defines a first reduced power area minimum 28 in a green color region of the spectral power distribution curve.

Figure 5:
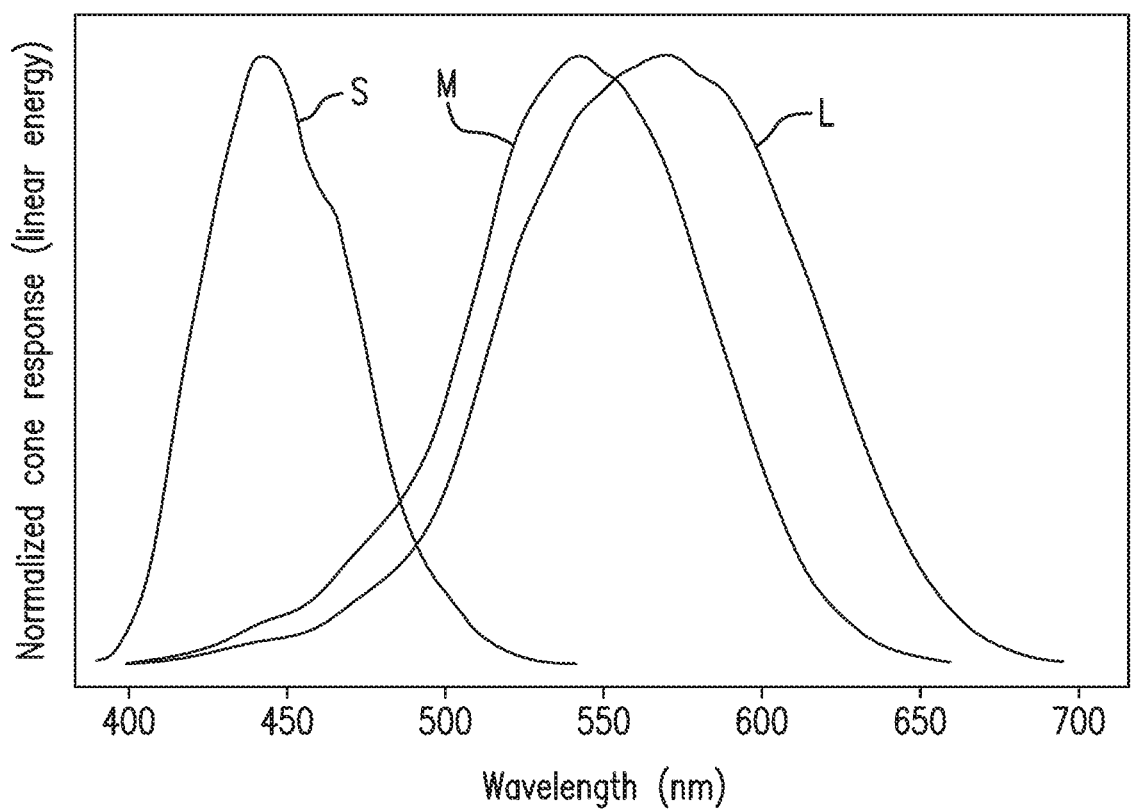
FIG. 5 is a chart illustrating the normalized cone response of a human that does not suffer from color blindness.
Figure 6:
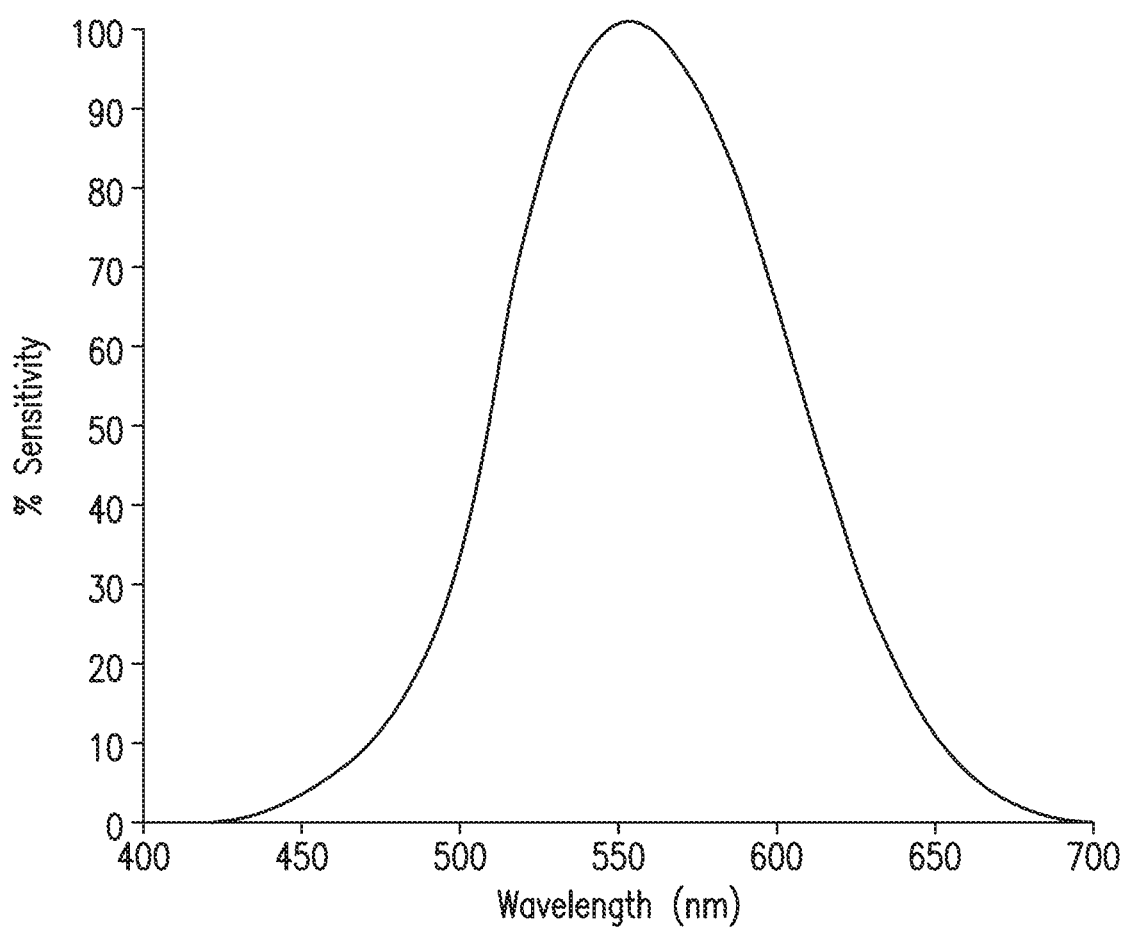
FIG. 6 is a chart illustrating the sensitivity of the human eye versus wavelength.

As shown by FIG. 6, the human eye generally has greatest sensitivity at approximately 555 nm under or normal "well-lit" conditions (10 to $10^8$ cd/m$^2$). Thus, as the wavelength of light is farther from 555 nm, the human eye has reduced sensitivity. As noted hereinbefore, the human eye utilizes short cones (S), medium cones (M), and long cones (L) for color vision. As shown in FIG. 5, there is significant overlap between the M cones and the L cones. Thus, it is desirable to reduce the power of the light in this overlap area to reduce cross-talk.

Figure 2:
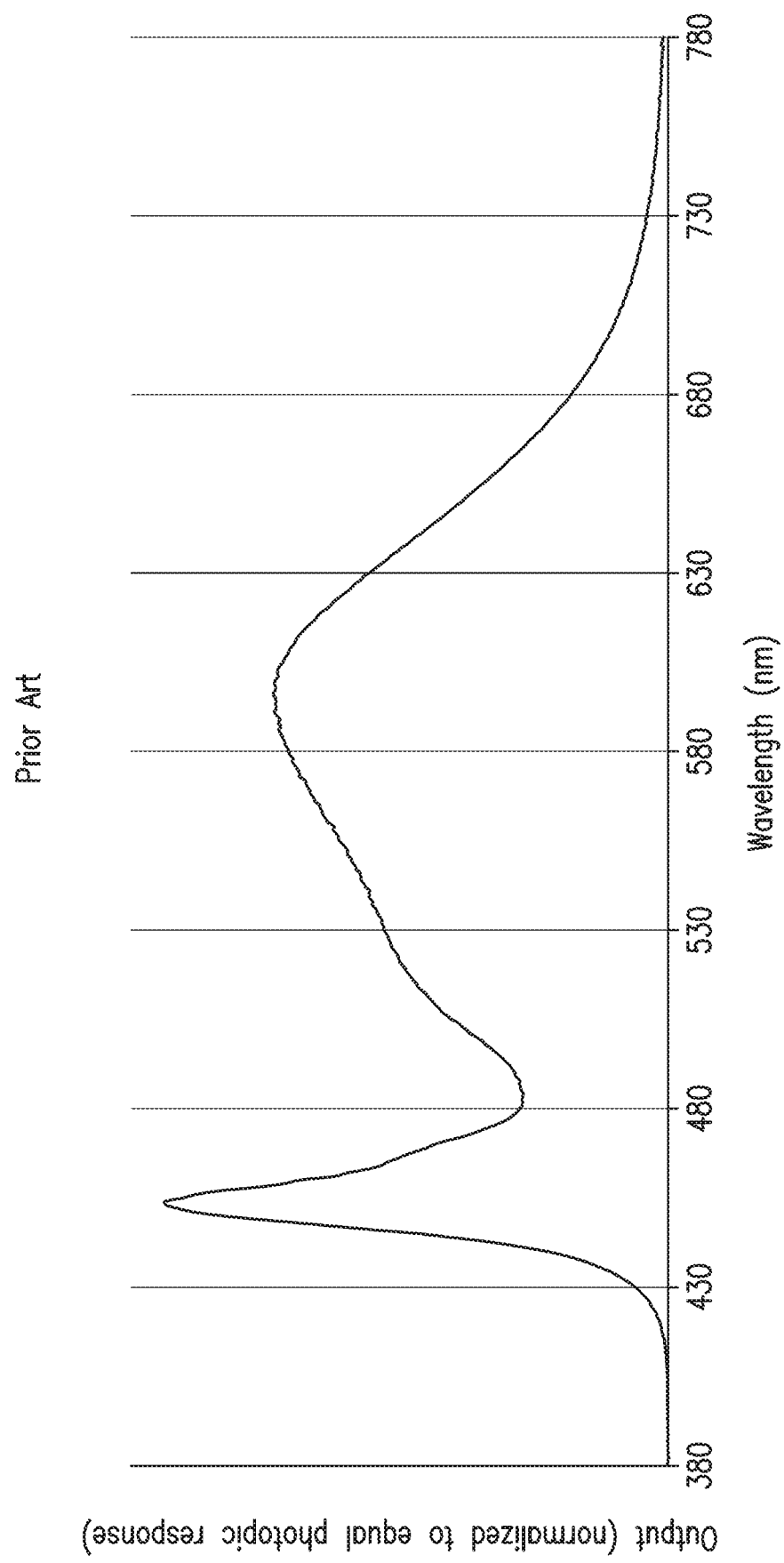
FIG. 2 is a spectral power distribution curve.

With reference to FIG. 2, the spectral power distribution curve of a typical lamp is shown. Notably, the spectral power distribution curve of a traditional lamp can include a peak at approximately 450 nm and another peak at approximately 600 nm with a trough extending therebetween. Thus, a traditional lamp has a minimum at approximately 480 nm, which is in the blue region of the visible light spectrum. Accordingly, with the peak at approximately 600 nm, the individuals that are exposed to the light from the traditional lamp experience significant amounts of light that has a power output peak in a region that is near where overlap can occur for the M and L cones.

This is in direct contrast to the spectral power distribution curves shown in FIGS. 3-4 of the lamp 10 of the present application. For example, the light source 12 of lamp 10 of the present disclosure is configured to emit the light such that the first power peak 22 is in the cyan color region and the second power peak 24 is in a red color region. More particularly, the first power peak 22 can be at approximately 500 nm and the second power peak 24 is at approximately 640 nm. Further, the light source 12 can be configured to emit light such that the first reduced power area 26 is from approximately 520 nm to approximately 570 nm and first reduced power area minimum 28 is at approximately 535 nm.

With continued reference to FIGS. 1 and 3-4, the light source 12 of the present disclosure can also be configured to emit the light such that the power of the light decreases when extending along the spectral power distribution curve from the first power peak 22 to the first reduced power area minimum 28 and increases when extending along the spectral power distribution curve from the first reduced power area minimum 28 to the second power peak 24.

The light source 12 can also be configured to emit the light such that the spectral power distribution curve defines a third power peak 32. For reference, the first power peak 22 can be between the third power peak 32 and the second power peak 24 in terms of wavelength. The third power peak 32 can be at approximately 450 nm. Further, this third power peak 32 can be utilized to excite phosphors of the lamp 10.

The light source 12 can also be configured to emit the light such that the spectral power distribution curve defines a second reduced power area 34 that extends between the third power peak 32 and the first power peak 22. Further, the second reduced power area 34 defines a second reduced power area minimum 36 in a blue color region of the spectral power distribution curve. As illustrated, the second reduced power area minimum 36 is less than the first reduced power area minimum 28 in terms of the power. As shown in the figures, the light source 12 is configured to emit the light such that the power of the light decreases when extending from the third power peak 32 to the second reduced power area minimum 36 and increases when extending from the second reduced power area minimum 36 to the first power peak 22. These specific wavelengths of light can restore hue contrast and perception for people that are color blind by emitting light that trends towards increased red saturation. Further, the light source 12 can be adapted to emit light from approximately 390 nm to approximately 500 nm and also from approximately 640 nm to approximately 700 nm.

Figure 7:
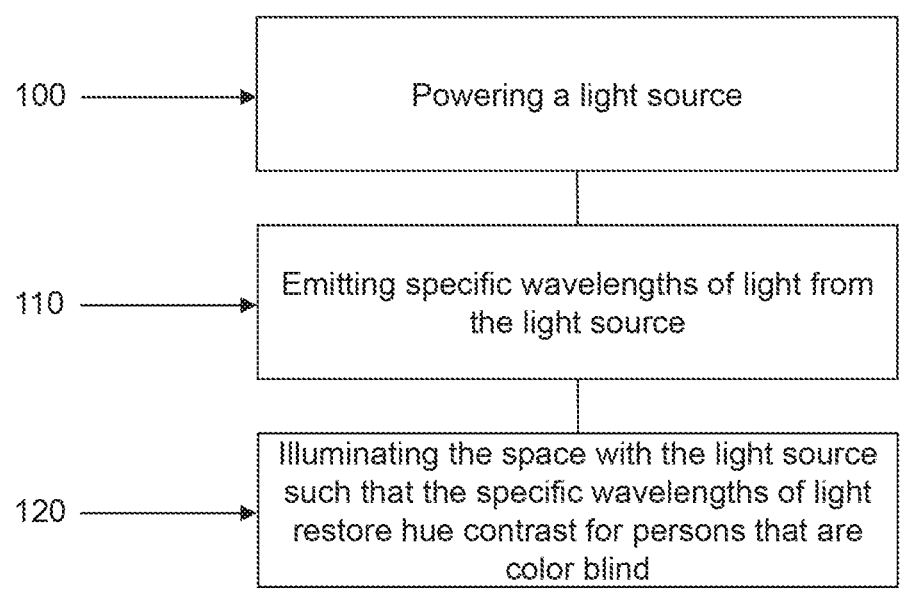
FIG. 7 is a flowchart illustrating a method of lighting a space.

With reference to FIG. 7, a method of lighting a space is shown. At 100, a light source 12 is powered, and specific wavelengths of light from the light source 12 are emitted at 110. Further, the space can be illuminated with the light source 12 such that the specific wavelengths of light restore hue contrast for persons that are color blind at 120. Additionally, the emitted light defines a spectral power distribution curve that includes a first power peak 22 and a second power peak 24 with a first reduced power area 26 that extends therebetween. The first reduced power area 26 defines a first reduced power area minimum 28 in a green color region of the spectral power distribution curve. Thus, the spectral power distribution curve compares a power of the light versus a wavelength of the light.

The lamp 10 provides numerous advantages over the known lamps. For example, the lamp 10 counters the spectral-physiologic effects of light. Particularly, the lamp 10 can be constructed to only emit certain wavelengths of light to achieve positive effects. One such positive effect can be filtering blue "high energy visible" (HEV) light that is linked with oxidation of the macula, a believed risk of aged macular degeneration. Another positive effect is to correct for some forms of color blind vision.

Further, the lamp 10 improves the color contrast for color blindness. This occurs with minimum detriment to perception of other colors, or general color cast. With regard to HEV, the filter 16 of the lamp 10 reduces the intensity of offending spectrum emitted from the lamp 10. The spectrum may also include blue light linked with circadian stimulation. Further, the lamp 10 can emit another, complementary frequency, to maintain color balance.

The above can be accomplished in a variety of ways without departing from the scope of this disclosure. For example, the lamp 10 can include a plurality of individual light elements 12a that emit various wavelengths of light so as to create a composite light beam as shown in FIGS. 3-4. Notably, the individual light elements 12a would emit wavelengths of light that are different from one another, but when combined, would collectively result in light as shown in FIGS. 3-4. These light elements 12a could be constructed with the example phosphors as noted hereinbefore. Alternatively, at least one light element 12a can emit wavelengths of light that are passed through the filter 16 so that the resulting light is as is shown in FIGS. 3-4. It is envisioned that other assemblies could result in the same outcome without departing from the scope of this disclosure.

The lamp 10 can be used in environments where color perception is especially important, such as offices and hospitals. Once the area near the lamp 10 is illuminated, individuals with color anomalous vision would benefit from improved color contrast. Further, the lamp 10 could be utilized in educational environments. Notably, students with color blindness are at a disadvantage for learning. However, classrooms lit with the lamp 10 as described herein would remove that learning barrier. Further still, the lamp 10 also has application in retail, particularly geared toward men, where product posturing can be improved with improved color perception.

Thus, the lamp 10 has applicability for general purpose lighting. For example, use of the lamp 10 would result in enhanced color saturation for individuals with normal vision (i.e., not color blind). Further, some recent studies indicate that such lighting is actually preferred. As a result, the lamp 10 would also have a positive effect on people with normal vision. Additionally, the lamp 10 would remove potentially harmful blue lighting from the environment, thereby potentially improving the health of the occupants of the related environment.

By utilizing the lamp 10, hues that would normally be poorly differentiated are more likely to appear redder or greener, partially restoring the ability to perceive these colors. Further, additional wavelengths can also be adjusted to maintain the white balance of the filter, or to improve blue-purple resolution that can be caused by Deuteranomaly. Further, individuals near the lamp 10 are not required to utilize special equipment to enjoy the benefits described hereinabove.

The lamp 10 restores hue contrast and perception for people with the most common forms of color blindness, while posing no significant negative impact to people of normal color vision. Put another way, it lets the color blind see what they could not before, while the rest do not notice the difference. In contrast to prior solutions, by lighting a space with a lamp that includes the aforementioned features, all people in the lit area are positively influenced and a solution is provided that does not a negative effect on the color perception of people with normal vision.

It will be appreciated that variations of the above-disclosed lamps and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A light emitting diode lamp, comprising:
a light source configured to emit light for general purpose lighting, wherein the light source defines a spectral power distribution curve including a first turning point defining a first power peak and a second turning point defining a second power peak with a first reduced power area extending therebetween, wherein the light source is configured to emit the light such that the first reduced power area is from 520 nm to 570 nm, wherein the first reduced power area includes a first reduced power area minimum located within a green color region of the spectral power distribution curve, the first reduced power area minimum being at 535 nm and outputs more power than a second reduced power area minimum being below 480 nm, wherein a power of light output at the first power peak approximately matches the power of light output at the second power peak, and wherein the spectral power distribution curve compares a power of the light versus a wavelength of the light.

2. The light emitting diode lamp of claim 1, wherein the light source is configured to emit the light such that the first power peak is in a cyan color region of the spectral power distribution curve and the second power peak is in a red color region of the spectral power distribution curve.

3. The light emitting diode lamp of claim 1, wherein the light source is configured to emit the light such that the first power peak is at approximately 500 nm and the second power peak is at approximately 640 nm.

4. The light emitting diode lamp of claim 1, wherein the light source is configured to emit the light such that the power of the light decreases when extending along the spectral power distribution curve from the first power peak to the first reduced power area minimum and increases when extending along the spectral power distribution curve from the first reduced power area minimum to the second power peak.

5. The light emitting diode lamp of claim 1, wherein the light source is configured to emit the light such that the spectral power distribution curve defines a third turning point defining a third power peak, and wherein the first power peak is between the third power peak and the second power peak in terms of the wavelength.

6. The light emitting diode lamp of claim 5, wherein the light source is configured to emit the light such that the third power peak is at 450 nm and is configured to excite green aluminate phosphors.

7. The light emitting diode lamp of claim 5, wherein the light source is configured to emit the light such that the spectral power distribution curve defines a second reduced power area that extends between the third power peak and the first power peak, wherein the second reduced power area defines a second reduced power area minimum in a blue color region of the spectral power distribution curve, and wherein the second reduced power area minimum is less than the first reduced power area minimum in terms of the power.

8. The light emitting diode lamp of claim 7, wherein the light source is configured to emit the light such that the power of the light decreases when extending from the third power peak to the second reduced power area minimum and increases when extending from the second reduced power area minimum to the first power peak.

9. The light emitting diode lamp of claim 1, wherein the light source includes a plurality of individual light elements that are narrow band light emitting diodes that emit different wavelengths of light.

10. The light emitting diode lamp of claim 9, wherein the narrow band light emitting diodes are devoid of phosphor.

11. The light emitting diode lamp of claim 1, wherein the light emitted by the light source has a fidelity index (Rf) of at least 70 and a Gamut Index (Rg) of at least 90 according to IES TM-30-15 Standard.

12. The light emitting diode lamp of claim 1, wherein the light source includes at least one individual light element that includes a green aluminate phosphor having an emission peak at 516 nm and an excitation range of 200 nm to 480 nm and a red nitride phosphor having an emission peak at 618 nm and an excitation range of 200 nm to 610 nm.

13. The light emitting diode lamp of claim 1, further comprising a housing that receives the light source, wherein the light source includes at least one light element that emits the light and a lens that permits a transmission of the light from the at least one light element to an area exterior to the lamp, and wherein the lens engages the housing such that the at least one light element is disposed entirely between the housing and the lens.

14. A light emitting diode lamp, comprising:
a light source configured to emit particular wavelengths of light from approximately 390 nm to 500 nm and from approximately 640 nm to 700 nm, wherein the light source is configured to emit light that defines a spectral power distribution curve that includes a first power peak and a second power peak, wherein a power of light output at the first power peak approximately matches the power of light output at the second power peak, wherein the light source is configured to emit light with a first reduced power from 520 nm to 570 nm with a first reduced power area minimum located within a green color region of the spectral power distribution curve at 535 nm, wherein the light source is configured to emit the light to define a second reduced power area that extends between a third power peak at 450 nm to the first power peak at 500 nm, wherein the third power peak is configured to excite green aluminate phosphors and a second reduced power area minimum that is defined by the second reduced power area is a blue color region of the spectral power distribution curve and is less than the first reduced power area minimum in terms of power.

* * * * *